United States Patent
Tain et al.

(10) Patent No.: US 11,013,103 B2
(45) Date of Patent: May 18, 2021

(54) METHOD FOR FORMING CIRCUIT BOARD STACKED STRUCTURE

(71) Applicant: Unimicron Technology Corp., Taoyuan (TW)

(72) Inventors: Ra-Min Tain, Hsinchu County (TW); Kai-Ming Yang, Hsinchu County (TW); Chien-Tsai Li, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 223 days.

(21) Appl. No.: 16/203,636

(22) Filed: Nov. 29, 2018

(65) Prior Publication Data

US 2019/0098746 A1  Mar. 28, 2019

Related U.S. Application Data

(62) Division of application No. 15/590,020, filed on May 9, 2017, now Pat. No. 10,178,755.

(51) Int. Cl.
| | | |
|---|---|---|
| *H05K 1/02* | (2006.01) | |
| *H05K 1/11* | (2006.01) | |
| *H05K 3/46* | (2006.01) | |

(52) U.S. Cl.
CPC ......... *H05K 1/0209* (2013.01); *H05K 1/0271* (2013.01); *H05K 1/114* (2013.01);
(Continued)

(58) Field of Classification Search
CPC .... H05K 3/4644; H05K 3/4682; H05K 1/113; H05K 1/115; H05K 3/4007;
(Continued)

(56) References Cited

U.S. PATENT DOCUMENTS 5,873,161 A * 2/1999 Chen .................. H01L 23/5385
257/E23.172
6,163,957 A * 12/2000 Jiang .................. H01L 21/4857
174/262

(Continued)

FOREIGN PATENT DOCUMENTS

| JP | 2016029697 A | 3/2016 |
|---|---|---|
| TW | 200807661 A | 2/2008 |
| TW | I620303 B | 4/2018 |

OTHER PUBLICATIONS

Jonas Zürcher et al., "Nanoparticle assembly and sintering towards all-copper flip chip interconnects", 2015 IEEE Electronic Components and Technology Conference (ECTC), pp. 1115-1121.

(Continued)

*Primary Examiner* — Peter Dungba Vo
*Assistant Examiner* — Jose K Abraham
(74) *Attorney, Agent, or Firm* — CKC & Partners Co., LLC

(57) ABSTRACT

A method for forming a circuit board includes forming a first dielectric layer, a first circuit layer in the first dielectric layer, a second circuit layer on the first dielectric layer, and a plurality of conductive vias in the first dielectric layer and connecting the first circuit layer to the second circuit layer; forming a second dielectric layer on the first dielectric layer and the second circuit layer; forming a plurality of openings in the second dielectric layer to expose a plurality of parts of the second circuit layer; forming a seed layer on the exposed parts of the second circuit layer and sidewalls of the openings; and forming a plurality of bonding layers on the seed layer, wherein the bonding layers and the seed layer are made of copper, and the bonding layers are porous.

6 Claims, 12 Drawing Sheets

(52) U.S. Cl.
CPC ... *H05K 3/4682* (2013.01); *H05K 2201/0116* (2013.01); *H05K 2201/0195* (2013.01); *H05K 2201/0338* (2013.01); *H05K 2201/0347* (2013.01); *H05K 2201/041* (2013.01)

(58) Field of Classification Search
CPC ...... H05K 3/4005; H05K 3/4015; H05K 3/42; H05K 3/32; H05K 3/328; H05K 2201/0116; H05K 2201/041; H05K 2201/0338; H05K 1/0271; H05K 1/0209; H05K 3/244; H05K 2201/01–04; H05K 3/421; H05K 1/114; H05K 2201/0347; H05K 2201/0195; H01L 23/49822; H01L 24/05; H01L 24/03; H01L 25/50; H01L 23/12; H01L 23/48
See application file for complete search history.

(56) References Cited

U.S. PATENT DOCUMENTS

| | | | |
|---|---|---|---|
| 7,183,648 B2 | 2/2007 | Ramanathan et al. | |
| 8,021,921 B2 | 9/2011 | Lin et al. | |
| 8,193,624 B1 | 6/2012 | Sohn et al. | |
| 8,421,225 B2 | 4/2013 | Ramanathan et al. | |
| 8,492,893 B1 | 7/2013 | Sohn et al. | |
| 8,791,562 B2 | 7/2014 | Lee et al. | |
| 9,117,825 B2 | 8/2015 | Liu et al. | |
| 9,355,977 B2 | 5/2016 | Lin et al. | |
| 9,462,690 B1 | 10/2016 | Darveaux et al. | |
| 9,576,929 B1 | 2/2017 | Shao et al. | |
| 9,679,806 B1 | 6/2017 | Arvin et al. | |
| 9,844,134 B2 | 12/2017 | Mischitz et al. | |
| 9,875,957 B2 | 1/2018 | Shimizu et al. | |
| 9,876,042 B2 | 1/2018 | Natanzon et al. | |
| 9,899,238 B2 | 2/2018 | Karhade et al. | |
| 9,978,710 B2 | 5/2018 | Dubey et al. | |
| 2005/0284655 A1* | 12/2005 | Hsu | H05K 3/4602 174/255 |
| 2008/0217049 A1* | 9/2008 | Dudnikov | H05K 1/18 174/260 |
| 2008/0272497 A1* | 11/2008 | Lake | H01L 21/76831 257/774 |
| 2008/0295326 A1* | 12/2008 | Tuominen | H01L 21/4846 29/832 |
| 2009/0051024 A1* | 2/2009 | Chia | H01L 24/20 257/686 |
| 2009/0241332 A1* | 10/2009 | Lauffer | H05K 3/462 29/829 |
| 2009/0273073 A1 | 11/2009 | Tachibana et al. | |
| 2011/0056740 A1* | 3/2011 | Takano | H05K 3/426 174/262 |
| 2011/0198114 A1 | 8/2011 | Maeda et al. | |
| 2012/0018871 A1 | 1/2012 | Lee et al. | |
| 2012/0119359 A1 | 5/2012 | Im et al. | |
| 2012/0186867 A1 | 7/2012 | Asai et al. | |
| 2013/0049229 A1 | 2/2013 | Su | |
| 2013/0127054 A1 | 5/2013 | Muthukumar et al. | |
| 2013/0140074 A1 | 6/2013 | Yang et al. | |
| 2014/0217062 A1 | 8/2014 | Kunstmann et al. | |
| 2014/0231126 A1* | 8/2014 | Hunrath | H05K 3/4614 174/264 |
| 2014/0242374 A1 | 8/2014 | Strasser et al. | |
| 2015/0121694 A1* | 5/2015 | Huang | H05K 3/4679 29/852 |
| 2015/0171038 A1 | 6/2015 | Lin | H01L 24/81 438/106 |
| 2016/0020163 A1* | 1/2016 | Shimizu | H01L 23/49822 361/768 |
| 2016/0079151 A1* | 3/2016 | Chiu | H05K 1/186 257/737 |
| 2016/0192496 A1* | 6/2016 | Wang | H01L 24/73 361/767 |
| 2016/0351529 A1 | 12/2016 | Brunschwiler et al. | |
| 2017/0047302 A1* | 2/2017 | Morita | H01L 24/05 |
| 2017/0194278 A1 | 7/2017 | Shao et al. | |
| 2017/0287871 A1 | 10/2017 | Lu | |
| 2018/0082933 A1 | 3/2018 | Ko et al. | |
| 2018/0332700 A1 | 11/2018 | Tain et al. | |
| 2019/0043819 A1 | 2/2019 | Ho et al. | |
| 2019/0043847 A1 | 2/2019 | Lee et al. | |
| 2019/0189561 A1 | 6/2019 | Rusli | |

OTHER PUBLICATIONS

Jonas Zurcher et al., "All-Copper Flip Chip Interconnects by Pressureless and Low Temperature Nanoparticle Sintering" 2016 IEEE 66th Electronic Components and Technology Conference (ECTC), May 31, 2016~Jun. 3, 2016, Las Vegas, NV,USA.

* cited by examiner

METHOD FOR FORMING CIRCUIT BOARD STACKED STRUCTURE

PRIORITY CLAIM AND CROSS-REFERENCE

The present application is a Divisional Application of the U.S. application Ser. No. 15/590,020, filed May 9, 2017, which is incorporated herein by reference in its entirety.

BACKGROUND

Technical Field

The present disclosure relates to a circuit board stacked structure and a method for forming the same.

Description of Related Art

With the rapid growth of the electronics industry, the R & D of electronic products has gradually been directed towards the pursuit of versatility and high performance. In order to achieve the requirements of high integration and miniaturization of semiconductor components, the requirements of circuit boards must also increase. For example, the pitch of the traces of the circuit board is required to become smaller and smaller, and the thickness of the circuit board is required to become smaller and smaller. When the pitch of the traces of the circuit board and the thickness of the circuit board become smaller, the yield is also more susceptible to a variety of external factors. For example, if the circuit board is put in a high temperature environment during manufacturing processes, the structure stability may be affected due to the different thermal expansion coefficients of different layers.

To further improve the circuit boards, persons in the industry have made every endeavor to discover new solutions. The application and improvement of the circuit boards has become one of the most important research topics.

SUMMARY

This disclosure provides a stacked structure and a method for forming the same to improve the overall structure stability.

In one aspect of the disclosure, a circuit board is provided. The circuit board includes a first dielectric layer, a first circuit layer, a second circuit layer, a plurality of conductive vias, a second dielectric layer, and a plurality of bonding layers. The first circuit layer is disposed in the first dielectric layer. The second circuit layer is disposed on the first dielectric layer. The conductive vias are disposed in the first dielectric layer and connect the first circuit layer to the second circuit layer. The second dielectric layer is disposed on the first dielectric layer and the second circuit layer and has a plurality of openings to expose a plurality of parts of the second circuit layer. The patterned seed layer is disposed on the exposed parts of the second circuit layer and sidewalls of the openings. The bonding layers are respectively disposed on the patterned seed layer. The bonding layers are made of porous copper.

In one or more embodiments, the sidewalls of the openings are tilted.

In one or more embodiments, the bonding layers and the patterned seed layer are conformally disposed on the exposed parts of the second circuit layer and the sidewalls of the openings.

In one or more embodiments, the openings are respectively filled with the bonding layers.

In one or more embodiments, each of the bonding layers has a concave surface.

In another aspect of the disclosure, a stacked structure is provided. The stacked structure includes the circuit board and a chip module. The chip module includes a body and a plurality of bumps. The bumps are disposed on the body. The bumps are made of copper. Each of the bonding layers includes a first part, and the first parts are respectively disposed in the openings. The bumps, the second circuit layer, the patterned seed layer, and the first parts are bonded with each other to form an integral solid structure, and the integral solid structure is substantially made of copper.

In one or more embodiments, a maximum width of each of the bumps is less than a maximum width of each of the openings.

In one or more embodiments, each of the bonding layers further includes a second part. The second parts are disposed outside the openings, and the second parts are made of porous copper.

In another aspect of the disclosure, a method for forming a circuit board is provided. The method includes the following operations: respectively forming a first circuit layer, a second circuit layer, a plurality of conductive vias, and a first dielectric layer, in which the first circuit layer is disposed in the first dielectric layer, the second circuit layer is disposed on the first dielectric layer, and the conductive vias are disposed in the first dielectric layer and connect the first circuit layer to the second circuit layer; forming a second dielectric layer on the first dielectric layer and the second circuit layer; forming a plurality of openings in the second dielectric layer to expose a plurality of parts of the second circuit layer; forming a seed layer on the exposed parts of the second circuit layer and sidewalls of the openings; and forming a plurality of bonding layers on the seed layer, in which the bonding layers are made of porous copper.

In another aspect of the disclosure, a method for forming a stacked structure is provided. The method includes the following operations: providing the circuit board and a chip module, in which a plurality of bumps of the chip module are made of copper; and bonding the bumps to the bonding layers, such that the bumps, the second circuit layer, the seed layer, and the bonding layers are bonded with each other to form an integral solid structure, and the integral solid structure is substantially made of copper.

The bumps are bonded to the bonding layers. Because the thermal expansion coefficients of the bumps and the bonding layers are the same, the connection portions of the bumps and the bonding layers will not break due to different thermal expansions. Further, when the bumps are bonded to the bonding layers, the sharp corners of the bumps will press the inclined surface of the bonding layers, thereby generating a driving force, such that the diffusion rate of the copper atoms in the bumps and the bonding layers can be effectively enhanced.

In addition, because the bonding layers are made of porous copper, the exchange rate of the copper atoms in the bumps and the bonding layers can be further enhanced when the bumps and the bonding layers are in contact with each other. Therefore, the temperature and the pressure required to carry out the bonding process of the bumps and bonding layer can be effectively lowered. At the same time, because the stacked structure does not need to withstand higher temperature and pressure, the overall structure stability of the stacked structure can be effectively improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
FIGS. 1A to 1I are schematic cross-sectional views of intermediate operations in a method for manufacturing a circuit board according to one embodiment of this disclosure.

FIGS. 1A to 1I are schematic cross-sectional views of intermediate operations in a method for manufacturing a circuit board 100 according to one embodiment of this disclosure. A method for forming a circuit board 100 is provided. First, as shown in FIG. 1A, a carrier 101 is provided.

Figure 1B:
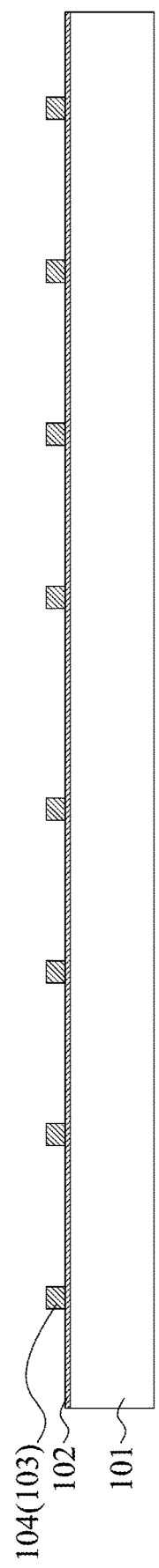

As shown in FIG. 1B, a metal bonding layer 102 is formed on the carrier 101. Then, a pad layer 103 is formed on the metal bonding layer 102. Finally, a plurality of pad 104 is formed by patterning the pad layer 103. Specifically, the metal bonding layer 102 may be made of titanium, and the pad layer 103 may be made of copper. The metal bonding layer 102 and the pad layer 103 may be formed by sputtering.

Figure 1C:
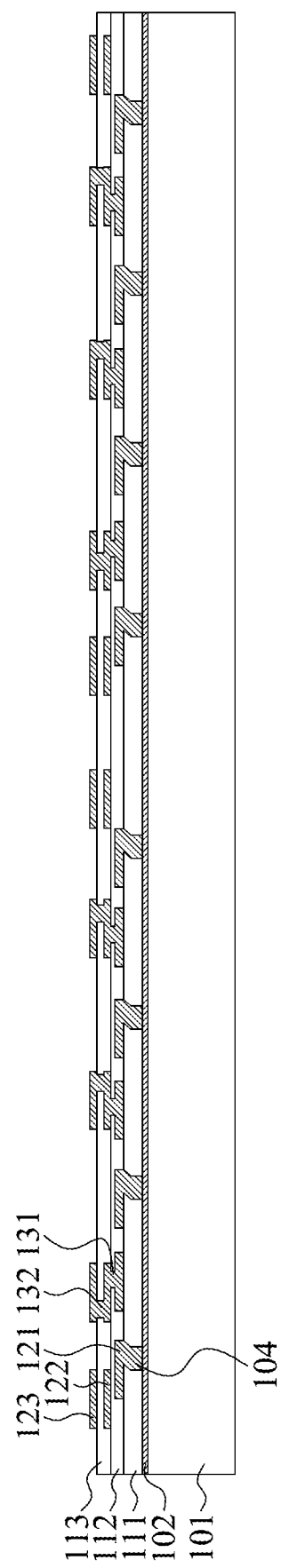

As shown in FIG. 1C, the dielectric layers 111, 112, and 113, the circuit layer 121, 122, and 123, a plurality of conductive vias 131, and a plurality of conductive vias 132 are respectively formed. The dielectric layer 111 is disposed on the metal bonding layer 102. The pad 104 is disposed in the dielectric layer 111. The circuit layer 121 is disposed on the dielectric layer 111 and in the dielectric layer 112, and the circuit layer 121 is connected to the pad 104. The dielectric layer 112 is disposed on the dielectric layer 111 and the circuit layer 121. The circuit layer 122 is disposed on the dielectric layer 112 and in the dielectric layer 113. The conductive vias 131 are disposed in the dielectric layer 112 and connect the circuit layer 121 to the circuit layer 122. The dielectric layer 113 is disposed on the dielectric layer 112 and the circuit layer 122. The circuit layer 123 is disposed on the dielectric layer 113. The conductive vias 132 are disposed in the dielectric layer 113 and connect the circuit layer 122 to the circuit layer 123. Specifically, the circuit layers 121, 122, and 123 and the conductive vias 131 and 132 may be made of copper.

Figure 1D:
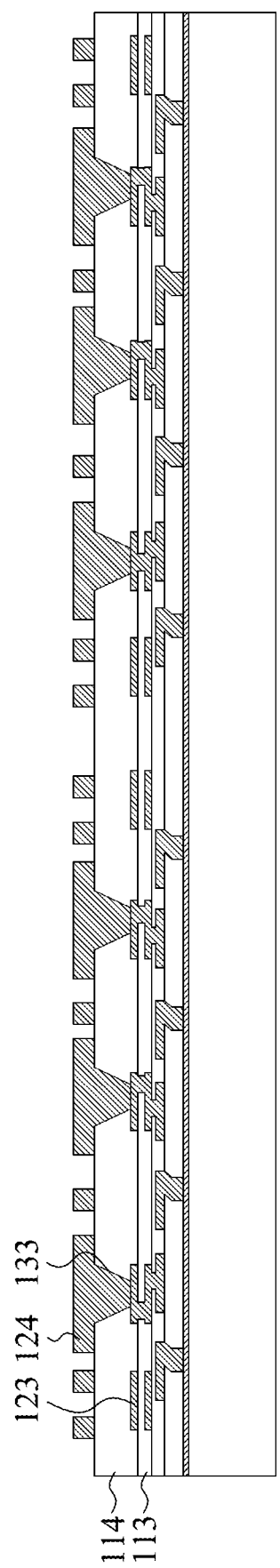

As shown in FIG. 1D, the dielectric layer 114, the circuit layer 124, and a plurality of conductive vias 133 are respectively formed. The dielectric layer 114 is disposed on the dielectric layer 113 and the circuit layer 123. The circuit layer 124 is disposed on the dielectric layer 114. The conductive vias 133 are disposed in the dielectric layer 114 and connect the circuit layer 123 to the circuit layer 124. Specifically, the circuit layer 124 and the conductive vias 133 may be made of copper.

Figure 1E:
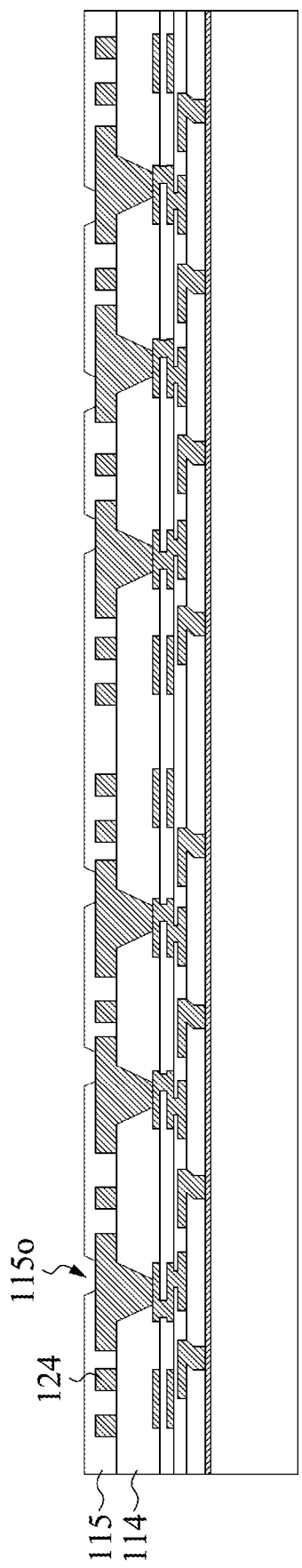

As shown in FIG. 1E, a dielectric layer 115 is formed on the dielectric layer 114 and the circuit layer 124. Then, a plurality of openings 115o are formed in the dielectric layer 115 to expose a plurality of parts of the circuit layer 124. The openings 115o may be formed by laser ablation. The sidewalls of the openings 115o are tilted.

Figure 1F:
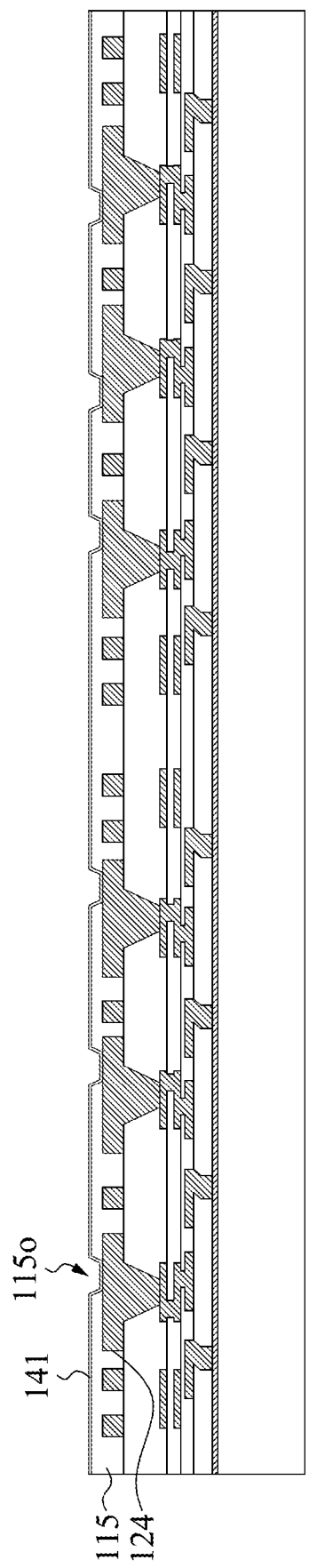

As shown in FIG. 1F, a seed layer 141 is formed on the exposed parts of the circuit layer 124, the sidewalls of the openings 115o, and the top surface of the dielectric layer 115 (i.e., the exposed parts of the circuit layer 124 and the dielectric layer 115). Specifically, the seed layer 141 may be made of copper.

Figure 1G:
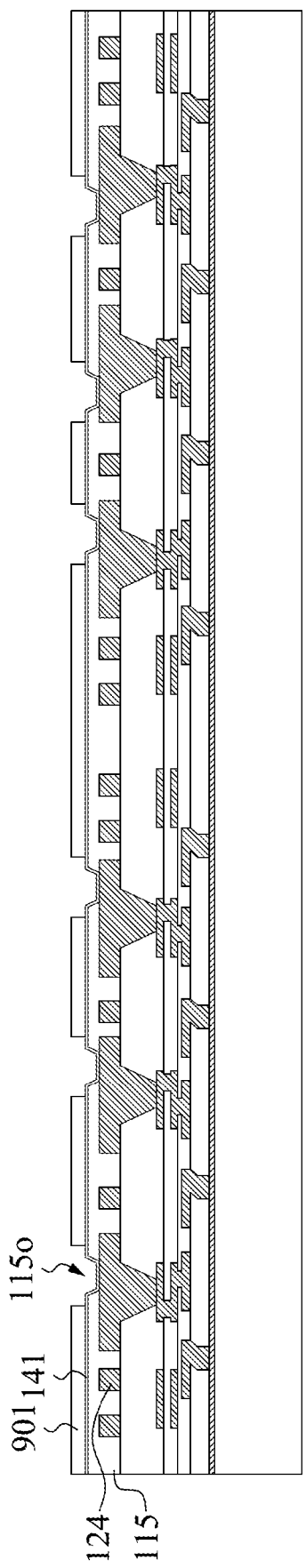

As shown in FIG. 1G, a photoresist 901 is formed on or above the top surface of the dielectric layer 115 or on the seed layer 141. The photoresist 901 exposes the seed layer 141 in the openings 115o (the parts of the seed layer 141 is disposed on the circuit layer 124 and the sidewalls of the openings 115o) and the seed layer 141 adjacent to the openings 115o (the parts of the seed layer 141 is disposed on the top surface of the dielectric layer 115).

Figure 1H:
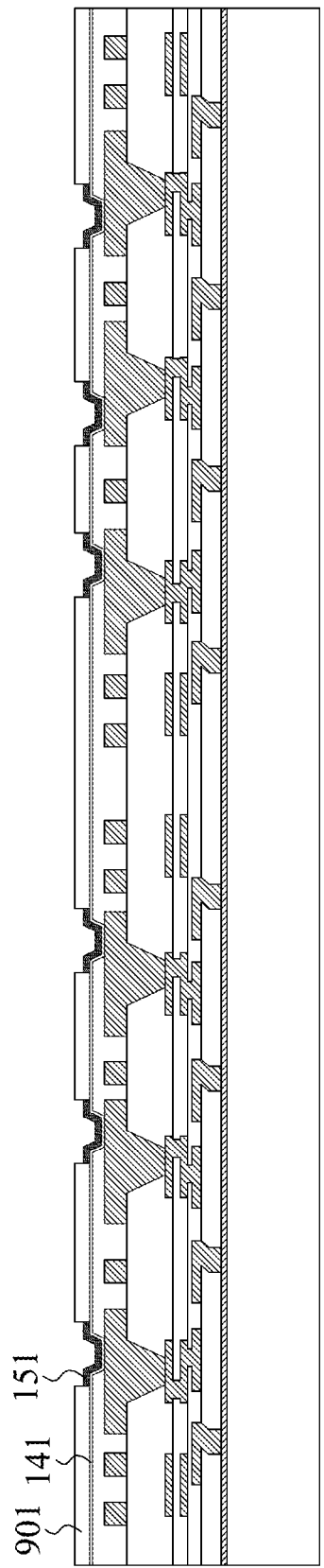

As shown in FIG. 1H, a plurality of bonding layers 151 are formed on the exposed parts of the seed layer 141. The bonding layers 151 are made of porous copper. In some embodiments, first, copper alloy layers are formed on the exposed parts of the seed layer 141. Then, the non-copper elements in the copper alloy layers are removed by the acid leaching process. Therefore, the bonding layers 151 are formed.

Figure 1I:
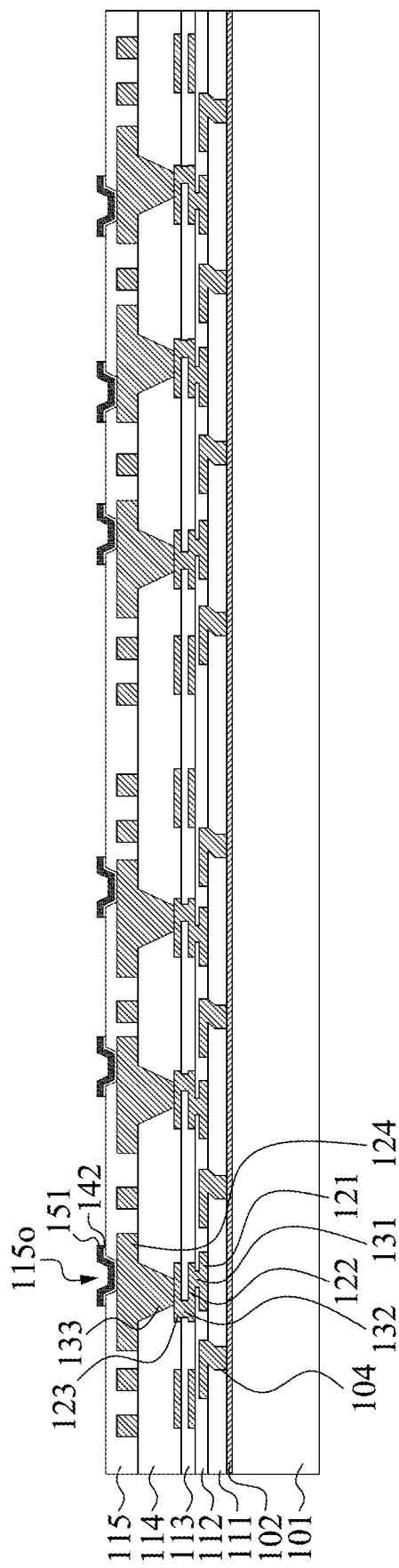

As shown in FIG. 1H and FIG. 1I, the photoresist 901 is removed, and the parts of the seed layer 141 which are not covered by the bonding layers 151 are removed. Therefore, a patterned seed layer 142 is formed.

Figure 1J:
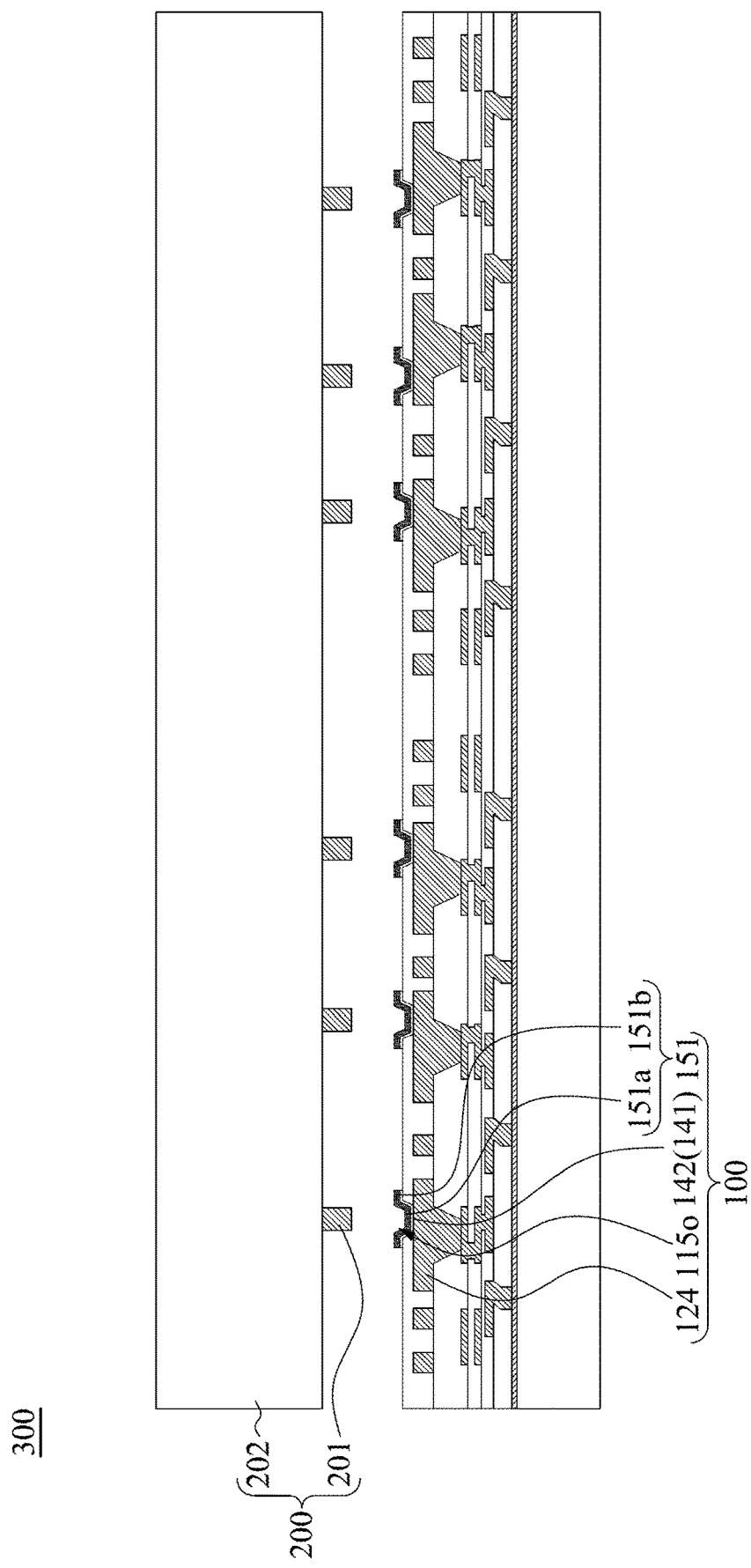
FIG. 1J and FIG. 1K are schematic cross-sectional views of intermediate operations in a method for manufacturing a stacked structure according to one embodiment of this disclosure.
Figure 1K:
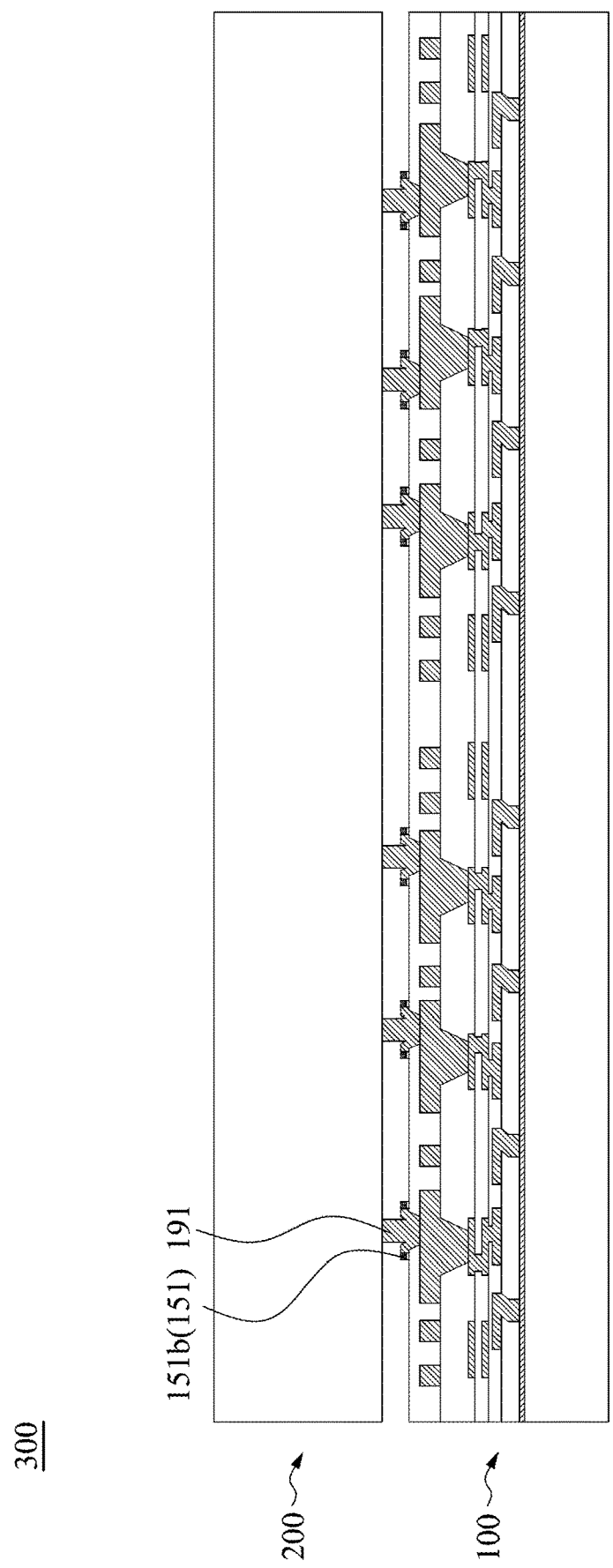

FIG. 1J and FIG. 1K are schematic cross-sectional views of intermediate operations in a method for manufacturing a stacked structure 300 according to one embodiment of this disclosure. As shown in FIG. 1J, the aforementioned circuit board 100 and the chip module 200 are provided. A plurality of bumps 201 of the chip module 200 may be made of copper.

As shown in FIG. 1J and FIG. 1K, the bumps 201 are bonded to the bonding layers 151, such that the bumps 201 and the bonding layer 151 are bonded with each other to form an integral solid structure 191. The integral solid structure 191 is substantially made of copper. The integral solid structure 191 is connected to the circuit layer 124 and the patterned seed layer 142 (the seed layer 141).

By bonding the bumps 201 and the bonding layers 151, which are both made of copper, the circuit board 100 is bonded to the chip module 200 to form the stacked structure 300. Because the thermal expansion coefficients of the bumps 201 and the bonding layers 151 are the same, the connection portions of the bumps 201 and the bonding layers 151 will not break due to thermal expansion when the stacked structure 300 is put in environments with different temperatures. Therefore, the structure stability of the stacked structure 300 can be effectively improved.

Further, when the bumps 201 are bonded to the bonding layers 151, the sharp corners of the bumps 201 will press the inclined surface of the bonding layers 151, thereby generating a driving force, such that the diffusion rate of the copper atoms in the bumps 201 and the bonding layers 151 can be effectively enhanced. Therefore, when the bumps 201 and the bonding layers 151 are in contact with each other, some of the copper atoms in the bumps 201 will exchange with some of the copper atoms in the bonding layer 151 to form an integral solid structure. Because of the driving force, the material of the integral solid structure becomes copper. Specifically, the bumps 201, the circuit layer 124, the patterned seed layer 142, and the bonding layers 151 are bonding with each other to form a conductive structure.

In addition, because the bonding layers 151 are made of porous copper, the diffusion rate of the copper atoms in the bumps 201 and the bonding layers 151 can be further enhanced when the bumps 201 and the bonding layers 151 are in contact with each other. Therefore, the temperature and the pressure required to carry out the bonding process of the bumps 201 and bonding layer 151 can be effectively lowered. At the same time, because the stacked structure 300 does not need to withstand higher temperature and pressure, the overall structure stability of the stacked structure 300 can be effectively improved.

The temperature required to carry out the bond process may be in a range from 120° C. to 250° C. The pressure required to carry out the bonding process may be in a range from about 3 MPa to about 9 MPa. In some embodiments, the temperature required to carry out the bond process may be in a range from 160° C. to 200° C. The pressure required to carry out the bonding process may be about 6 MPa.

Figure 2:
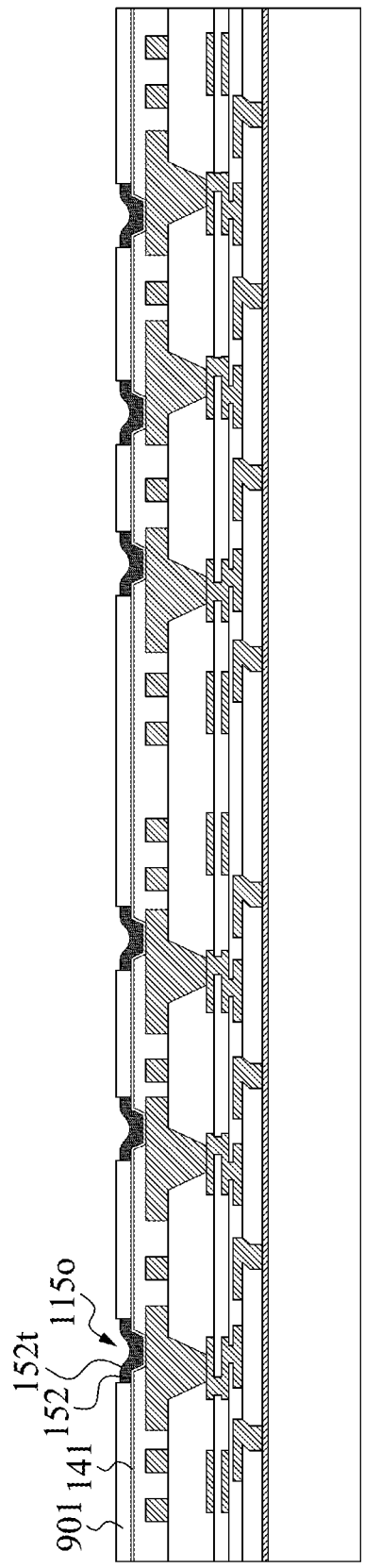
FIG. 2 is a schematic cross-sectional view of an intermediate operation in the method for manufacturing the circuit board according to another embodiment of this disclosure.

FIG. 2 is a schematic cross-sectional view of an intermediate operation in the method for manufacturing a circuit board 100 according to another embodiment of this disclosure. As shown in FIG. 2, this embodiment is similar to the aforementioned embodiment, and the main difference between the two is that, in this embodiment, instead of forming a thin film on the seed layer 141, the bonding layers 152 respectively fill the openings 115o when the bonding layers 152 are formed. At the same time, each of the bonding layers 152 has a concave surface 152t.

The dielectric layers 111, 112, 113, 114, and 115 may be formed by lamination. Embodiments of this disclosure are not limited thereto. The person having ordinary skill in the art can make proper modifications to the dielectric layers 111, 112, 113, 114, and 115 depending on the actual application.

The circuit layers 121, 122, 123, and 124 may be formed by the following operations. First, photoresists (not shown in Figs), for example, dry films, are formed on the dielectric layers 111, 112, 113, and 114. Then, the photoresists are patterned to expose a plurality of parts of the dielectric layers 111, 112, 113, and 114 by lithography processes. Then, the plating process is formed. Finally, the photoresists are removed. Therefore, the circuit layers 121, 122, 123, and 124 are formed.

The conductive vias 131, 132, and 133 may be formed by the following operations. First, blind holes, which may be formed by laser ablation, are formed in the dielectric layers 112, 113, and 114 before the circuit layers 122, 123, and 124 are formed. Then, the conductive vias 131, 132, and 133 are formed by the plating process when the circuit layers 122, 123, and 124 are formed.

It is noted that the number of the dielectric layers and the circuit layers may vary depending on the actual requirements of the circuit board 100 and may not be limited to the aforementioned embodiments.

In another aspect of the disclosure, a circuit board 100 is provided. As shown in FIG. 1I, the circuit board 100 includes a carrier 101, a metal bonding layer 102, a plurality of pads 104, dielectric layers 111, 112, 113, 114, and 115, circuit layers 121, 122, 123, and 124, a plurality of conductive vias 131, a plurality of conductive vias 132, a plurality of conductive vias 133, a patterned seed layer 142, and a plurality of bonding layers 151. The metal bonding layer 102 is disposed on the carrier 101. The dielectric layer 111 is disposed on the metal bonding layer 102. The pads 104 are disposed on the metal bonding layer 102 and in the dielectric layer 111. The dielectric layer 112 is disposed on the dielectric layer 111 and the circuit layer 121. The circuit layer 121 is disposed in the dielectric layer 112 and on the dielectric layer 111. The dielectric layer 113 is disposed on the dielectric layer 112 and the circuit layer 122. The circuit layer 122 is disposed in the dielectric layer 113 and on the dielectric layer 112. The conductive vias 131 are disposed in the dielectric layer 112 and connect the circuit layer 121 to the circuit layer 122. The dielectric layer 114 is disposed on the dielectric layer 113 and the circuit layer 123. The circuit layer 123 is disposed in the dielectric layer 114 and on the dielectric layer 113. The dielectric layer 114 is disposed on the dielectric layer 113 and the circuit layer 123. The circuit layer 123 is disposed in the dielectric layer 114 and on the dielectric layer 113. The conductive vias 132 are disposed in the dielectric layer 113 and connect the circuit layer 122 to the circuit layer 123. The dielectric layer 115 is disposed on the dielectric layer 114 and the circuit layer 124. The circuit layer 124 is disposed in the dielectric layer 115 and on the dielectric layer 114. The circuit layer 124 is made of copper. The conductive vias 133 are disposed in the dielectric layer 114 and connect the circuit layer 123 to the circuit layer 124. The dielectric layer 115 has a plurality of openings 115o to expose a plurality of parts of the circuit layer 124. The patterned seed layer 142 is disposed on the exposed parts of the circuit layer 124 and sidewalls of the openings 115o. The patterned seed layer 142 is made of copper. The bonding layers 151 are respectively disposed on the patterned seed layer 142. The bonding layers 151 are made of porous copper.

The sidewalls of the openings 115o are tilted. The bonding layers 151 and the patterned seed layer 142 are conformally disposed on the exposed parts of the circuit layer 124 and the sidewalls of the openings 115o. Embodiments of this disclosure are not limited thereto. In some other embodiments, for example, as shown in FIG. 2, the openings 115o are respectively filled with the bonding layers 152, and each of the bonding layers 152 has a concave surface 152t.

In another aspect of the disclosure, a stacked structure 300 is provided. As shown in FIG. 1J and FIG. 1K, the stacked structure 300 includes the circuit board 100 and a chip module 200. The chip module 200 includes a body 202 and a plurality of bumps 201. The bumps 201 are disposed on the body 202. The bumps 201 are made of copper. Each of the bonding layers 151 includes a first part 151a, and the first parts 151a are respectively disposed in the openings 115o. The bumps 201 are bonded to the first parts 151a to form an integral solid structure 191. The integral solid structure 191 is substantially made of copper. The integral solid structure 191, the circuit layer 124, the patterned seed layer 142 (the seed layer 141) is connected to each other.

The maximum width of each of the bumps 201 is less than the maximum width of each of the openings 115o. Therefore, the sharp corners of the bumps 201 are ensured to press the inclined surface of the bonding layers 151.

In some embodiments, each of the bonding layers 151 further includes a second part 151b. The second parts 151b are disposed outside the openings 115o, and the second parts are made of porous copper. Because the bumps 201 only press the first parts 151a in the openings 115o, the second parts 151b outside the openings 115o will not be pressed by the bumps. Therefore, the material of the second parts 151b will not change and maintains as porous copper.

The bumps 201 are bonded to the bonding layers 151. Because the thermal expansion coefficients of the bumps 201 and the bonding layers 151 are the same, the connection portions of the bumps 201 and the bonding layers 151 will not break due to different thermal expansions. Further, when the bumps 201 are bonded to the bonding layers 151, the sharp corners of the bumps 201 will press the inclined surface of the bonding layers 151, thereby generating a driving force, such that the diffusion rate of the copper atoms in the bumps 201 and the bonding layers 151 can be effectively enhanced.

In addition, because the bonding layers 151 are made of porous copper, the exchange rate of the copper atoms in the bumps 201 and the bonding layers 151 can be further enhanced when the bumps 201 and the bonding layers 151 are in contact with each other. Therefore, the temperature and the pressure required to carry out the bonding process of the bumps 201 and bonding layer 151 can be effectively lowered. At the same time, because the stacked structure 300 does not need to withstand higher temperature and pressure, the overall structure stability of the stacked structure 300 can be effectively improved.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. § 112, 6th paragraph. In particular, the use of "step of" in the claims herein is not intended to invoke the provisions of 35 U.S.C. § 112, 6th paragraph.

What is claimed is:

1. A method for forming a circuit board, comprising:
respectively forming a first circuit layer, a second circuit layer, a plurality of conductive vias, and a first dielectric layer, wherein the first circuit layer is disposed in the first dielectric layer, the second circuit layer is disposed on the first dielectric layer, and the conductive vias are disposed in the first dielectric layer and connect the first circuit layer to the second circuit layer;
forming a second dielectric layer on the first dielectric layer and the second circuit layer;
forming a plurality of openings in the second dielectric layer to expose a plurality of parts of the second circuit layer;
forming a seed layer on the exposed parts of the second circuit layer and sidewalls of the openings;
forming a plurality of bonding layers on the seed layer, wherein the bonding layers are made of a material the same as the seed layer, the bonding layers and the seed layer are made of copper, and the bonding layers are porous;
providing a chip module, wherein the chip module comprises a plurality of bumps that are made of copper; and
bonding the bumps of the chip module to the bonding layers, such that the bumps, the second circuit layer, the seed layer, and the bonding layers are bonded with each other to form an integral solid structure, and the integral solid structure is substantially made of copper.

2. The method of claim 1, wherein each of the plurality of the bonding layers has a thicker thickness than the seed layer.

3. The method of claim 1, wherein forming the plurality of bonding layers on the seed layer comprises:
forming a patterned photoresist over the seed layer to expose a plurality of first parts of the seed layer that are in the plurality of openings in the second dielectric layer; and
forming the plurality of bonding layers on the plurality of exposed first parts of the seed layer, respectively.

4. The method of claim 3, further comprising:
after forming the plurality of bonding layers, removing the patterned photoresist.

5. The method of claim 4, further comprising:
after removing the patterned photoresist, removing a plurality of second parts of the seed layer that are not covered by the plurality of bonding layers.

6. A method for forming a circuit board, comprising:
respectively forming a first circuit layer, a second circuit layer, a plurality of conductive vias, and a first dielectric layer, wherein the first circuit layer is disposed in the first dielectric layer, the second circuit layer is disposed on the first dielectric layer, and the conductive vias are disposed in the first dielectric layer and connect the first circuit layer to the second circuit layer;
forming a second dielectric layer on the first dielectric layer and the second circuit layer;
forming a plurality of openings in the second dielectric layer to expose a plurality of parts of the second circuit layer;
forming a seed layer on the exposed parts of the second circuit layer and sidewalls of the openings; and
forming a plurality of bonding layers on the seed layer, wherein the bonding layers are made of a material the same as the seed layer, the bonding layers and the seed layer are made of copper, and the bonding layers are porous, and forming the plurality of bonding layers on the seed layer comprises:
forming a patterned photoresist over the seed layer to expose a plurality of first parts of the seed layer that are in the plurality of openings in the second dielectric layer; and
forming the plurality of bonding layers on the plurality of exposed first parts of the seed layer, respectively.

* * * * *